(12) United States Patent
Kloosterman et al.

(10) Patent No.: US 8,070,971 B2
(45) Date of Patent: Dec. 6, 2011

(54) ETCH METHOD

(75) Inventors: Jan Kloosterman, Eindhoven (NL); Paul Dijkstra, Eindhoven (NL)

(73) Assignee: NXP B.V., Eindhoven (NL)

( * ) Notice: Subject to any disclaimer, the term of this patent is extended or adjusted under 35 U.S.C. 154(b) by 790 days.

(21) Appl. No.: 11/628,517

(22) PCT Filed: May 27, 2005

(86) PCT No.: PCT/IB2005/051744
§ 371 (c)(1),
(2), (4) Date: Jun. 10, 2008

(87) PCT Pub. No.: WO2005/119768
PCT Pub. Date: Dec. 15, 2005

(65) Prior Publication Data
US 2008/0280105 A1    Nov. 13, 2008

(30) Foreign Application Priority Data
Jun. 4, 2004  (EP) ................................. 04102537

(51) Int. Cl.
*B44C 1/22*  (2006.01)
*G03F 1/00*  (2006.01)

(52) U.S. Cl. ............... 216/41; 216/47; 216/58; 216/83; 430/5; 430/311; 430/312; 430/313

(58) Field of Classification Search ............. 216/41, 216/47, 58, 83; 430/5, 311, 312, 313
See application file for complete search history.

(56) References Cited

U.S. PATENT DOCUMENTS 6,387,774 B1 * 5/2002 Yoo ........................ 438/396
7,037,626 B2 * 5/2006 Dirksen et al. ............... 430/5

* cited by examiner

*Primary Examiner* — Shamim Ahmed

(57) ABSTRACT

An improved method of etching a structure and a structure etched by the method is disclosed. The bottom side of a leadframe of an IC-package is an example of a structure, which advantageously may be etched with the disclosed method. The method includes the steps of providing an etch mask to the substrate to be etched. The etch mask comprising at least two sub-mask: a first sub-mask covering the area which substantially should remain after the etching process, and a second sub-mask covering an area to be removed in the etching process. The second sub-mask is a sacrificial mask in the form of a grid. The presence of the second sub-mask increases the etching speed in the area covered by it.

10 Claims, 5 Drawing Sheets

ETCH METHOD

Figure 1:
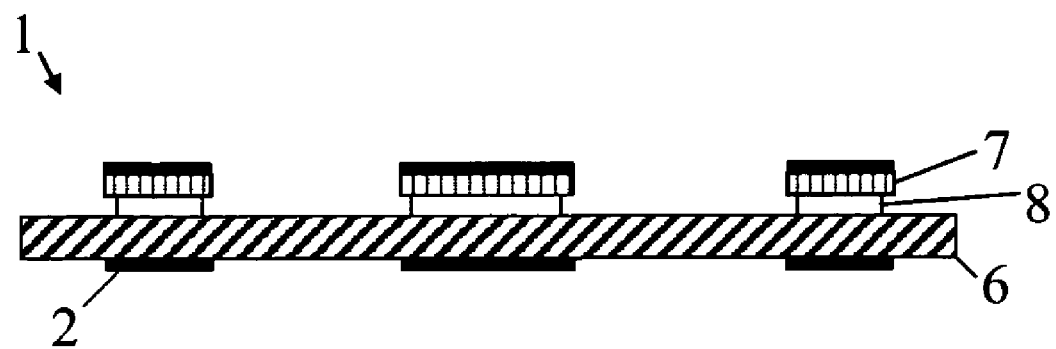

The invention relates to a method of etching a structure and a structure etched by the method and in particular to back-etching of a structure, such as a leadframe for an IC-package.

The manufacture and packaging of semiconductor devices comprises a plurality of steps. As a first step a wafer full of semiconductor devices, or dies, is processed. The individual dies are separated and mounted on a leadframe. The leadframe providing electrical access to the semiconductor device itself by supporting electrical connections between bond pads on the die and electrical connections which may be accessed after the die has been packaged and sealed off.

Many types of packages exist and new types are being developed, e.g. to produce smaller packages. Smaller packages support smaller lead wires, which are desirable, inter alia, for high-frequency applications, since large pins degrade high-frequency signals.

In a typical package an epoxy resin layer covers the semiconductor device and the leads are small metal pins protruding from the side of the package. However, in the newer smaller package types, the leadframe is etched out of a surface of the package, typically etched out of the backside of the package, so that the leadframe is an integral part of the package.

One example of such a package is described in the PCT-application WO/03/085728. There a die is attached to a pre-etched layered substrate. The die is encapsulated in an epoxy and the backside of the intermediate package is further etched to produce a package with leads protruding from the backside of the package.

In order to pattern a substrate in a desired way, e.g. to produce a package with leads protruding in a desired way, a surface of the package may be patterned by means of an etch mask and a subsequent etching. However, in an etching process part of the substrate covered by the mask is also removed during etching, the so-called under-etching. Thus, during the etching process more and more material is removed under the etch mask. Some under-etching is normally unavoidable and tolerable, but a critical under-etching should be avoided. For a given thickness of a substrate to be removed a given etching time is necessary, therefore a minimum resolution of the desired pattern is, among other parameters, a function of the thickness of the substrate. In order to increase the resolution of the pattern it may be a solution to reduce the thickness of the substrate. However, a certain thickness of the resulting structures may be needed, rendering a thinning of the substrate below a certain thickness impossible.

The inventors of the present invention have appreciated that under-etching of a desired etch mask may be undesirable and have in consequence devised the present invention.

It is a first object of the present invention to provide an improved etch method for etching out a structure, such as a pattern, in a substrate.

It is another object of the invention to provide an improved etch method to pattern a side, or surface, of an electronic device.

It is a further object of the invention to provide an etch mask on a side, or surface, of a partly fabricated electronic device allowing for the possibility of further patterning the side, or surface, at a later stage in the fabrication without use of photolithography.

Accordingly there is provided a method of etching a structure, the method comprising the following steps:

providing a substrate of a first material with on top of the substrate an etch mask in a desired pattern of a second material, the etch mask comprising at least two sub-masks:

a first sub-mask covering a first area in a first sub-pattern, the first sub-mask substantially remaining after the etching process, and a second sub-mask covering a second area in a second sub-pattern, the second sub-mask being a sacrificial mask, the sacrificial mask increasing the etching speed in the at least second area, etching the substrate a predetermined time.

The substrate may be the bottom side of an electronic device or a side on which it is desirable to etch out a pattern. For example, the substrate may be an outer layer in a layered structure, such as the bottom side of a leadframe. In general the substrate may be the outer layer covering any type of structure, including a substrate comprising an integrated circuit, a semiconductor based sensor, a MEMS-device, a filter such as a bulk acoustic wave filter, a network of passive components, etc. The substrate may also be a side of a device supporting more than one semiconductor devices, the substrate may then also be used as an additional interconnection layer for interconnection of the device.

As an example, a leadframe may be fabricated in a series of processing steps, the steps usually include photolithography on a top side of the leadframe. The bottom side of the leadframe may be provided with an etch mask including the first and second sub-masks. Subsequently, a semiconductor component, i.e. a die, may be provided to the leadframe and encapsulated in a way so that the leadframe may be mechanical anchored in the encapsulation, thus the die and the leadframe form a single unit. This is often referred to as the packaging. In a later processing step, the leadframe may be further etched so that a pattern according to the first sub-mask may be provided. It is an advantage than the leadframe may be etched after the packaging process without use of lithography, e.g. since photolithography processing may be avoided in the assembly factory.

Generally, the substrate is a substrate to be patterned in a desired way. The substrate is divided into at least two regions, a region that shall remain after the etching processing and a region that shall be removed by the etching process. The desired pattern to remain after the etching process may comprise a plurality of isolated structures. Each of the isolated structures may have substantially the same shape, some of the isolated structures may have substantially the same shape, while other have a different shape, a variety of different shapes of the isolated structures may be present, etc.

In order to etch out the pattern an etch mask is provided on a surface of the substrate. The etch mask comprises two sub-mask. A first sub-mask for defining the desired pattern or desired structures to remain after the etching process and a second sub-mask. The second sub-mask being a sacrificial mask having the purpose of increasing the etch speed in the area it covers. The second sub-mask is thus provided in an area to be removed by the etching process, the second sub-mask is also removed by the etching process. The first and second sub-mask may be provided in a single step, or the first and second sub-mask may be provided in two steps, or a series of steps. The etch mask may be provided according to any suitable way of providing an etch mask. For example, the etch mask may be provided by plating a pattern. As another example, the etch mask may be provided using a polymer etching mask, i.e. a resist. The etch mask may be a positive or negative etch mask.

The ratio between the etching speed in the vertical direction of the substrate, or z-direction and horizontal direction of the substrate, i.e. any direction in the (x,y)-plane of the substrate, may be increased in the area covered by the second sub-mask.

An advantage of the method according to the present invention is that the resolution of a desired pattern to be etched out of a substrate can be increased without reducing the thickness of the substrate. Alternatively, it may be an advantage that the thickness of the substrate may be determined without taking a desired resolution of the pattern into account. A further advantage is that for a substrate with a substantial thickness in comparison to the resolution of the pattern, a substantial uniform etching of the substrate may be achieved.

The desired pattern to remain after the etching process may be constituted by one or more isolated structures. These structures being one or more regions in the substrate before etching, the regions being covered on a surface by the first sub-mask and referred to as first regions. Likewise, the second sub-mask defines one or more regions of the substrate to be removed during the etching process, these regions are referred to as second regions. Also regions not being covered by an etch mask may be present, such regions may also be removed in the etching process. The second sub-mask may be provided in a region, and thereby defining a second region of the substrate, when the size of the second region is larger than the size of a first region. It may be an advantage to provide an etch mask according to the present invention in a situation where one or more second regions are larger than at least one first region.

The material of the substrate, i.e. the first material, may be a metal or a material with a conductivity of a metal. Examples of materials include Al, Cu, Ni or any alloys of mixtures of those. The substrate may form part of a stack of materials, where the individual materials in the stack are metals or materials with the conductivity of a metal. For example, the substrate may be a part of a Cu/Al/Cu stack, Cu/Al stack, Cu/Ni/Cu stack, etc. As a general example, the substrate may be a part of a metal stack from which the individual metals can be etched away separately. The material may be conductive e.g. if the substrate forms part of a leadframe, where the resulting structures constitutes the leads. The substrate may however also be of a semiconductor material or insulating material. The thickness of the substrate may be between 10 and 100 micrometers, such as between 25 and 75 micrometers, such as 50 micrometers.

The material of the etch mask, i.e. the second material, may be a material with a solderable finish. Thus, the material may be a material which supports soldering, i.e. the material may be adhered to a surface of another object by means of solder. For example in connection with flip chip mounting where two objects are attached to each other by means of solder bumps. Examples of materials include Ag, Pd, Au, Ni or any alloys of mixtures of those, such as NiPdAu. As a general example, the material of the etch mask may be a material which is not attacked, or attacked at a much lower rate, by the etchant used to etch away the substrate. It may be an advantage to use a material as the etch mask which has a solderable finish.

The pattern of the sacrificial mask, i.e. the pattern of the second sub-mask may be in the form of a grid, such as a square grid, rectangular grid, hexagonal grid, etc. Further the crossing points in the grid may be enlarged or reduced in size compared to simple crossing of bars. The second sub-mask may in the form of the branches of the grid, or the second sub-mask may be in the form of the openings in the grid.

The grid may be made up of sub-units of the sacrificial mask. The sub-units may be provided with a specific size where the characteristic size of the sub-units is correlated with the thickness of the substrate and an etching factor of the process. The characteristic size of the sub-unit is e.g. in case the shape of the sub-units are quadratic the width of the sub-units, and in case the sub-units are circular the diameter of the sub-unit. However, the sub-units may also possess a more complicated shape, in this case the characteristic size is a characteristic width or length of the sub-units.

The thickness of the substrate may depend upon a number of factors, and the etching factor may depend upon the material of the substrate, the pattern to be etched, etc. Therefore the size and shape of the sub-units may depend upon the thickness of the substrate and the etching factor. The ratio between the characteristic size of the sub-units and the thickness of the substrate may be between 0.75 and 1.25 of a ratio between the characteristic size and the etching factor, such as between 0.85 and 1.15, such as between 0.95 and 1.05, such as approximately equal. Thus a ratio of approximately 1:1:1 may be provided.

According to another aspect of the invention, a pattern on a surface of a substrate is provided in accordance with an etch mask, wherein the substrate before etching is being covered with the etch mask, the etch mask comprising at least two sub-masks:

a first sub-mask covering a first area in a first sub-pattern, the first sub-mask substantially remaining after the etching process, and a second sub-mask covering a second area in a second sub-pattern, the second sub-mask being a sacrificial mask, the sacrificial mask increasing the etching speed in the at least second area, wherein after the etching process the area of the substrate in contact with the first sub-pattern is at least 30% of the area of the first sub-pattern, such as at least 40%, such as at least 50%, such as at least 60%, such as at least 70%, such as at least 80%, such as at least 90%, such as almost 100%.

Due to under-etching of an etch mask, the area of the substrate in contact with the etch mask after the etching process is less than the area of the etch mask. Depending upon the pattern to be etched, a variation in etching speed may be present across a substrate, giving rise to a variation of the degree of under-etching across a substrate. In general it is an advantage of the invention that pattern which may be obtained by use of the invention, may be provided with a smaller degree of under-etching, than the same patterns etched out, or tried etched out, without use of the invention.

As a consequence of the invention, thicker leadframes may be used in IC packaging. It may be an advantage to use a leadframe with a certain thickness since a more rigid leadframe may be obtained, a more rigid leadframe may be desirable since less attention should be given to the handling of the leadframe or IC package. However, since thicker leadframes may result in a larger degree of under-etching, thick leadframes are without use of the invention limited in the obtainable resolution of the desired pattern. A consequence of the invention is that the etching factor is increased in the areas which are provided with the second sub-mask. The etching factor depends upon different aspects, such as the material of the substrate, the shape and size of the second sub-mask, etc. However, the higher the etching factor that may be achieved, the thicker the substrate may be used.

It is a further advantage of the invention that non-standard bottom layouts of leadframes used in the manufacture of IC-packages may be provided by the method of the present invention.

These and other aspects, features and/or advantages of the invention will be apparent from and elucidated with reference to the embodiments described hereinafter.

Figure 2:
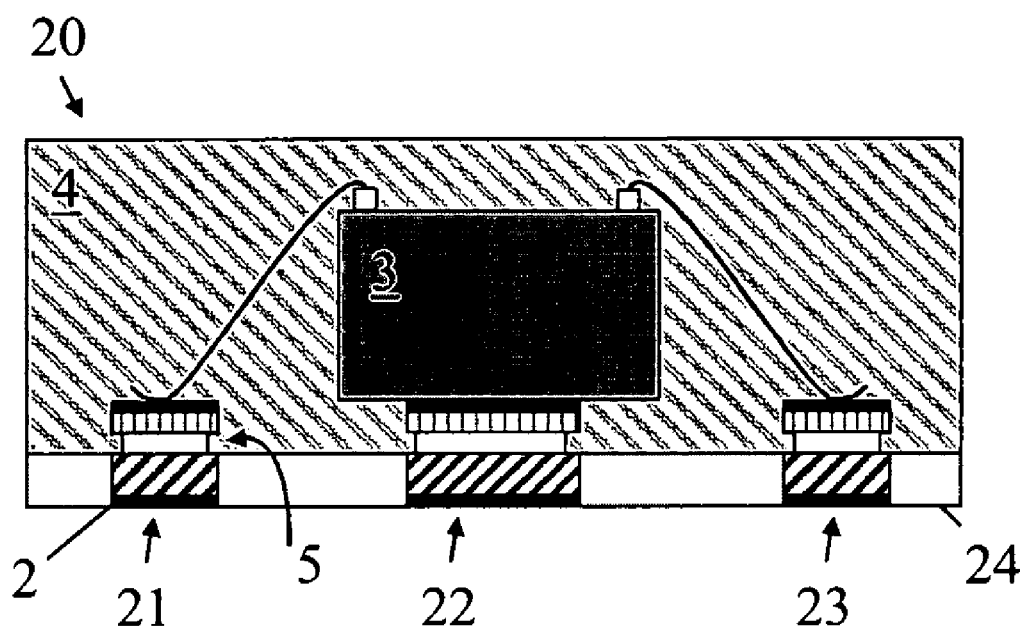
Figure 3:
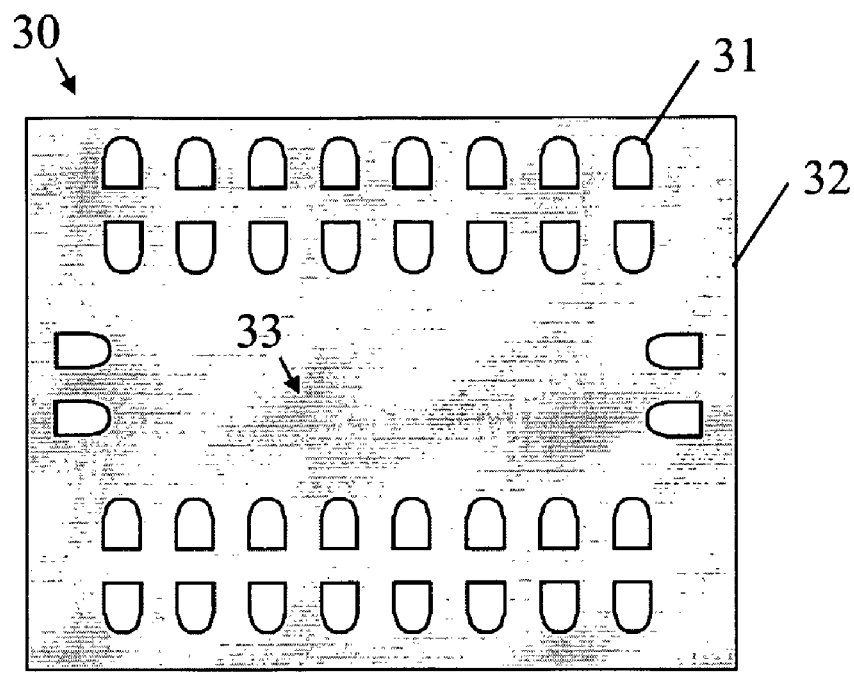
Figure 4:
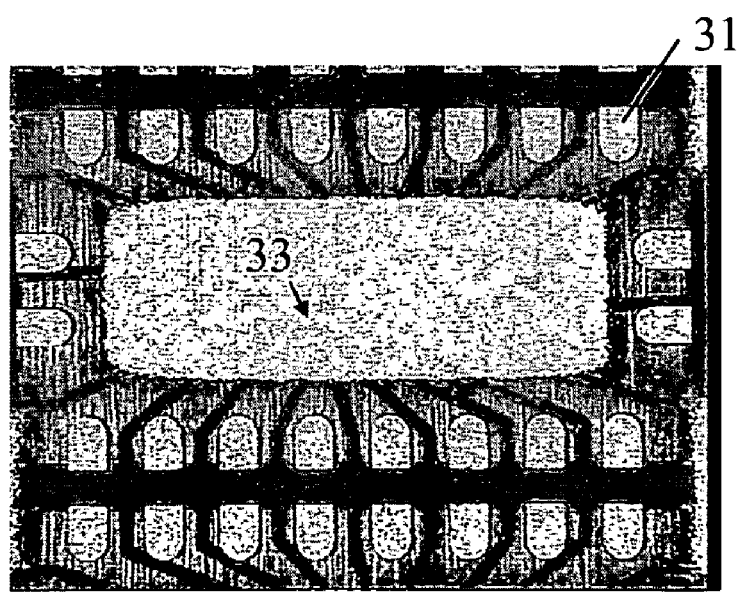
Figure 5:
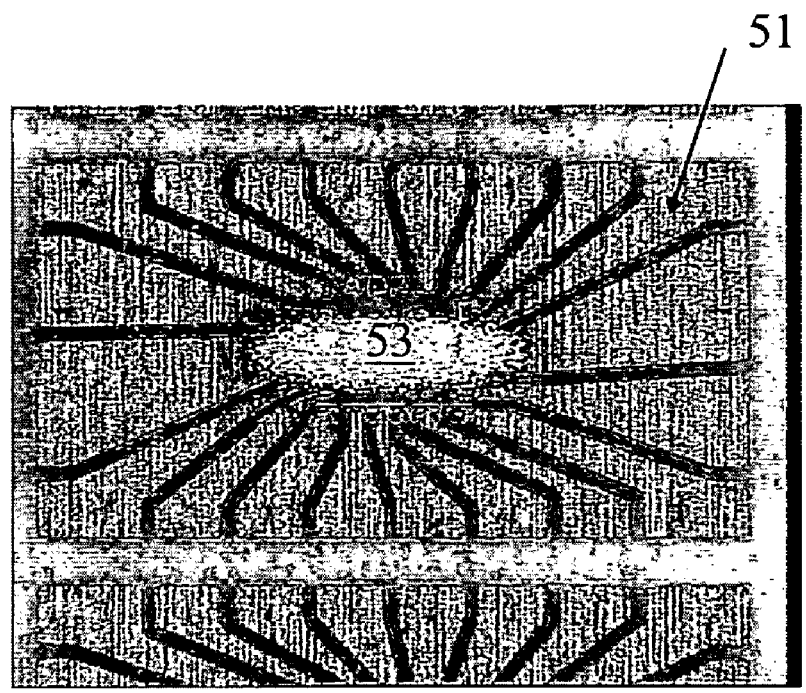
Figure 6:
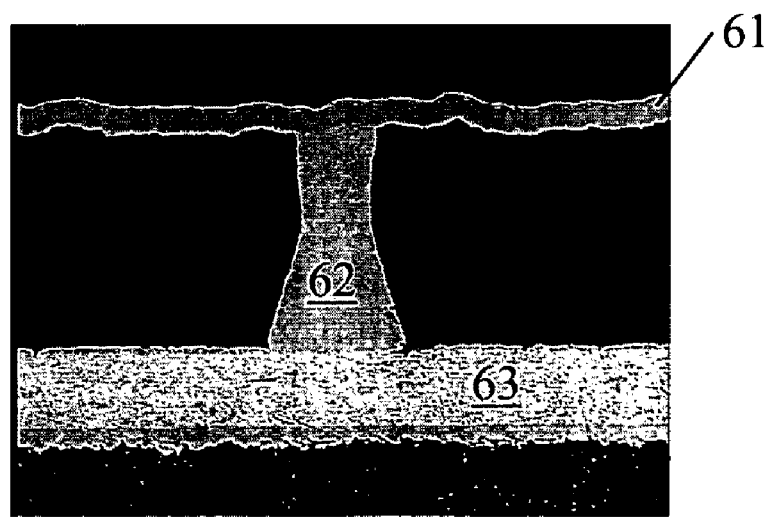
Figure 7:
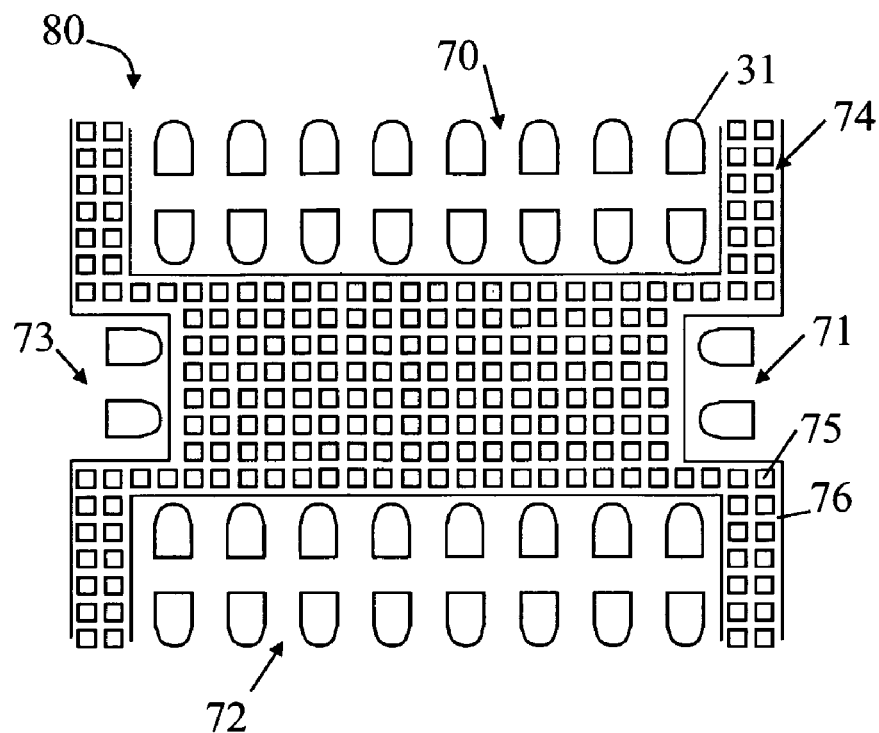
Figure 8:
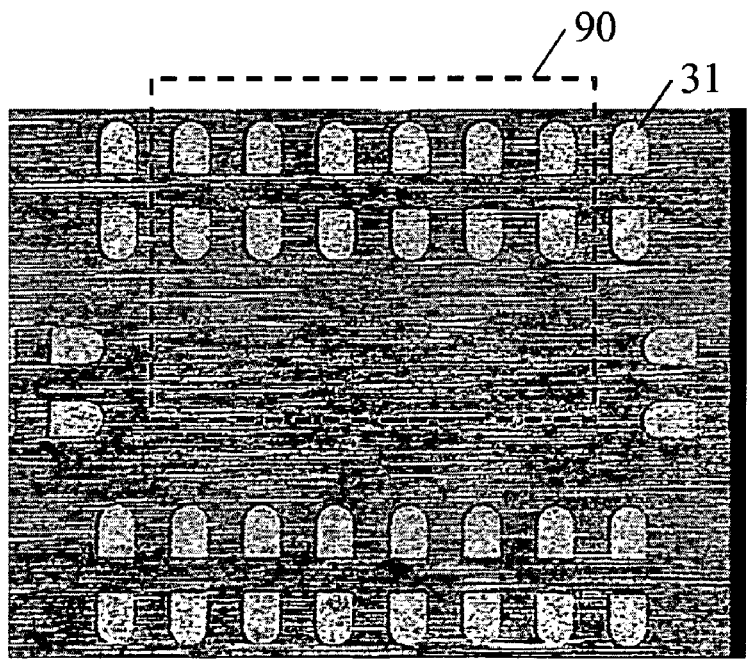
Figure 9:
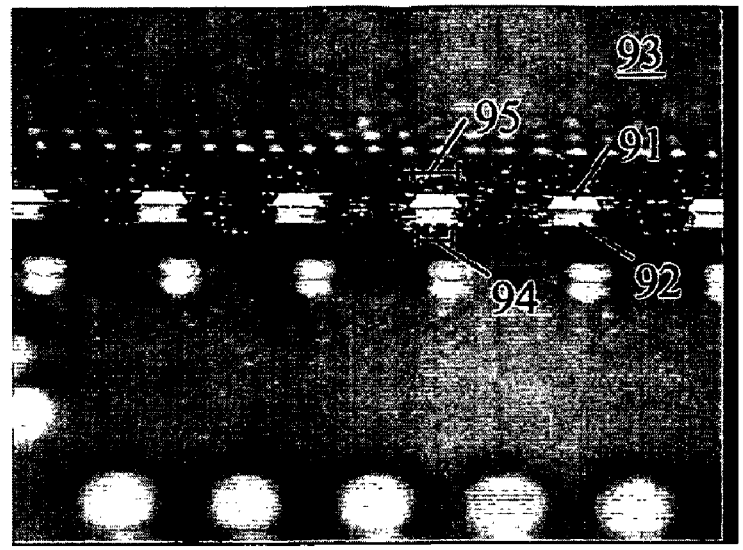
Figure 10:
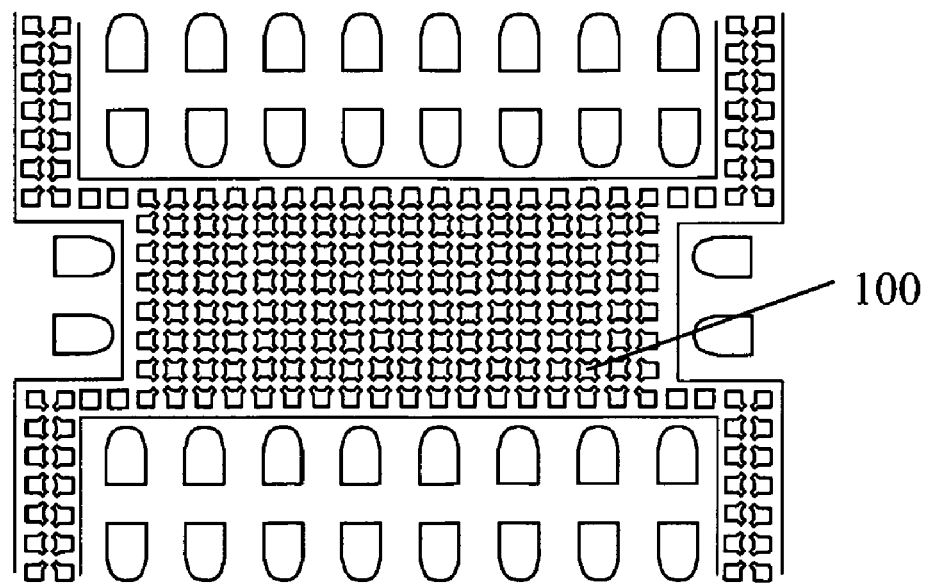

Preferred embodiments of the invention will now be described in details with reference to the drawings in which:

FIG. 1 illustrates a leadframe prior to attachment of a semiconductor device to it, FIG. 2 illustrates an IC-package, FIG. 3 illustrates an embodiment of a configuration of leads on the bottom side of an IC-package, FIG. 4 illustrates an etching of a substrate when the invention is not used, FIG. 5 illustrates another etching of a substrate when the invention is not used, FIG. 6 illustrates under-etching of an etch mask, FIG. 7 illustrates a first embodiment of an etch mask according to the present invention, FIG. 8 illustrates an etching of a substrate when the etch method according to the invention is used, FIG. 9 illustrates under-etching of an etch mask when the etch method according to the invention is used, and FIG. 10 illustrates a second embodiment of an etch mask according to the present invention.

The figures are schematic and not drawn to scale. Like reference numerals in different figures refer to the same or similar parts. The figures and the description are merely examples and should not be considered to set the scope of the present invention.

The manufacture and packaging of semiconductor devices comprises a plurality of steps. In this section the invention is described in connection with back etching of a leadframe, the leadframe being fabricated from a Cu/Al/Cu laminate by use of a NiPd—Au etch mask plated onto the surface of the substrate. Referring to FIG. 1, the materials of the leadframe is Cu 7, Al 8 and Cu 6. In the present embodiment, the substrate is thus a Cu layer 6.

In FIG. 1 a number of steps have already been conducted. The figure illustrates a leadframe prior to attachment of a semiconductor device. Producing a leadframe 1 as illustrated in FIG. 1 is known in the art (see e.g. the PCT-application WO/03/085728). The leadframe is terminated at a bottom side by a substrate 6.

In FIG. 2, a final IC-package 20 is illustrated. In the figure, a semiconductor device, or die, 3 is wire bonded to the upper side of the leadframe. The die and part of the leadframe is encapsulated in an encapsulation material such as an epoxy 4. The leadframe is anchored in the epoxy by means of small recesses 5. The steps involved in arriving at a final IC-package according to the present invention is discussed in connection with the subsequent figures. In FIG. 2 part of the substrate 6 is etched away in accordance with the pattern of an etch mask 2 so that isolated leads (21-23) are created, thereby providing an electrical connection from the outside of the package to the die. A protective insulating layer 24 is provided between the leads. The protective layer may be a so-called conversion layer. being a layer of a material chosen from the group of $CrO_2$, $TiO_2$, $ZrO_2$, $CeO_2$ or the like. An organic layer with a well-chosen coefficient of thermal expansion may be applied thereon.

An example of a desired configuration 30 of leads protruding from the bottom side of an IC-package is illustrated in FIG. 3 (the leads are hereafter also referred to as footprints).

In the FIGS. 4-6 and 8, 9 a NiPd—Au pattern is created on the bottom side of the package. The NiPd—Au patterns are used as an etch mask, or etch resist, for etching the Cu on the bottom side of the package. The thickness of the Cu layer ranges from 30 to 90 micrometer. The figures illustrate pictures obtained by use of a normal microscope.

In the pattern as illustrated in FIG. 3, the area 33 in the middle of the package is many times larger than the area under the individual footprints 31. Thus, the area/region in the middle of the substrate defines what is referred to as a second area/region elsewhere in the text, whereas the areas/regions defined by the footprints define what is referred to a first areas/regions elsewhere in the text. Due to the difference in size the Cu areas under the NiPd—Au footprints are etched away faster than the Cu in the middle of the package if a standard etching method is used, where only the area to remain after the etching process is covered by the etch mask. The size of the footprint may vary according to the desired IC-package. However a typical footprint size is usually between 150×250 and 250×350 micrometers.

In FIGS. 4 and 5 the etching capability is shown in a situation where the invention is not used, typically an etching factor of 0.2 to 0.75 can be achieved. The etching factor is the ration between the etching speed in the z-direction and the etching speed in the x-direction (or any other direction in the (x,y)-plane).

In FIG. 4, the etching is stopped when the material between the footprints is removed so that the footprints are isolated from each other. However, the Cu 33 in the middle of the package is still remaining on the surface, due to the low etching factor.

In FIG. 5, the etching is stopped when the Cu 53 in the middle is almost removed. In this situation, however, the footprints 51 are also removed.

Due to the thickness of the Cu layer on the bottom of the package under-etching of the NiPd—Au pattern render etching of a high-resolution pattern of the bottom side of the package difficult. The under-etching of the etch mask is illustrated in FIG. 6 which shows a cross-section of a substrate. The NiPd—Au footprint 61 is in this situation almost released from the leadframe, since the Cu 62 in contact with the Al 63 is almost removed due to under-etching.

In FIG. 7 an etch mask 80 according to the invention is illustrated. The etch mask is divided into a first sub-mask and a second sub-mask. The first sub-mask comprises the desired pattern, i.e. the first sub-mask 70, 71, 72, 73 is provided in accordance with the desired footprints 31, i.e. a NiPd—Au mask is provided in four regions 70-73 of the substrate, the NiPd—Au mask covering the areas of the desired footprints 31. A second sub-mask 74 is provided in an area to be removed. The second sub-mask is in the illustrated embodiment constituted by a pattern of small rectangular areas. The second sub-mask is made up of areas 76 covering the Cu, i.e. branches on the grid, and areas 75 not covering the Cu, i.e. openings in the grid. By used of an etch mask as illustrated in FIG. 7 the etch speed may be increased to such an extend that a net etch factor of 1 to 1.5 may be achieved. The second sub-mask is a sacrificial mask and it is removed during the etch process. The second sub-mask is removed due to that the material underneath the mask is etch away.

In FIG. 8 the bottom side of a lead frame similar to those in FIGS. 4 and 5 is illustrated, however the substrate being etched in accordance with the present invention, i.e. by use of the etch mask illustrated in FIG. 7. It is seen that the Cu in the middle of the package is completely removed, while the footprints 31 are not.

In FIG. 9 the resulting under-etching of the footprints is illustrated for a leadframe as illustrated in FIG. 8. The figure illustrates a section corresponding to the area marked 90 in FIG. 8, but viewed at a slightly inclined angle. In the figure a dark area 93 and a number of bright spots 91, 92 are seen. The dark area 93 is where the Cu has been removed, while the bright spots are the footprints. Each of the footprints are split in two, and upper part 91 being the NiPd—Au mask and a lower part 92 being the copper underneath the mask. Thus, the figure corresponds to FIG. 6, except that FIG. 6 is a close-up side view of a footprint, whereas FIG. 9 shows several footprints viewed at a slightly inclined angle. It is seen that the width of the Cu 94 underneath the NiPd—Au, is almost as large as the width of the NiPd—Au footprints 95, thus the under-etching is inhibited by used of the etch mask illustrated in FIG. 7.

Creating a sacrificial mask on the bottom side of the package results in the fact that a high resolution pattern can be etched. Dividing the large Cu area in the middle of the package results in the fact that the area of the Cu in direct contact with the etchant is decreased, this however results in an increased etching speed in the area covered by the second sub-mask, i.e. in the middle of the package. In the etch mask illustrated in FIG. 7 the small rectangles are 60 by 60 micrometers large. The size of the rectangular areas will, inter alia depend on the thickness of the substrate, and of the etching factor of the process. The shape of the open areas may also vary. In FIG. 10 is an alternative embodiment illustrated. In the pattern small protrusions are provided at the edges of the open spaces 100. This minimises the size of the open space between four pads, and allows for that the diagonal of the space is of the same length as a side face.

Although the present invention has been described in connection with preferred embodiments, it is not intended to be limited to the specific form set forth herein. Rather, the scope of the present invention is limited only by the accompanying claims.

In this section, certain specific details of the disclosed embodiment such as back etching of a leadframe, choice of materials, number and form of leads, etc., are set forth for purposes of explanation rather than limitation, so as to provide a clear and thorough understanding of the present invention. However, it should be understood readily by those skilled in this art, that the present invention may be practised in other embodiments which do not conform exactly to the details set forth herein, without departing significantly from the spirit and scope of this disclosure. Further, in this context, and for the purposes of brevity and clarity, detailed descriptions of well-known apparatus, circuits and methodology have been omitted so as to avoid unnecessary detail and possible confusion.

It will be appreciated that reference to the singular is also intended to encompass the plural and vice versa, and references to a specific numbers of features or devices are not to be construed as limiting the invention to that specific number of features or devices. Moreover, expressions such as "include", "comprise", "has", "have", "incorporate", "contain" and "encompass" are to be construed to be non-exclusive, namely such expressions are to be construed not to exclude other items being present.

Reference signs are included in the claims, however the inclusion of the reference signs is only for clarity reasons and should not be construed as limiting the scope of the claims.

The invention claimed is:

1. Method of etching a package substrate, the package substrate having a plurality of leads connecting an IC device, the method comprising:
   providing a package substrate of a first material with, on top of the substrate, an etch mask in a desired pattern of a second material, the etch mask comprising at least two sub-masks:
      a first sub-mask covering a first area in a first sub-pattern, the first sub-mask substantially remaining after an etching process, and
      a second sub-mask covering a second different area in a second sub-pattern, the second sub-mask being a sacrificial mask, the sacrificial mask increasing the etching speed in the at least second area,
   etching the package substrate such that the plurality of leads become isolated from one another.

2. Method according to claim 1, wherein the ratio between the etching speed in the vertical direction of the substrate and horizontal direction of the substrate is increased in the at least second area.

3. Method according to claim 1, wherein at least a part of the etch mask covers a first area, the first region remaining after the etching of the substrate, and wherein at least part of the etch mask defines a second region, the second region is to be removed by the etching of the substrate, wherein the size of the second region being larger than the size of the first region, and wherein the sacrificial mask is provided in the second region.

4. Method according to claim 1, wherein the first material is a conductive material.

5. Method according to claim 1, wherein the second material has a solderable finish.

6. Method according to claim 1, wherein the pattern of the sacrificial mask is a grid.

7. Method according to claim 6, wherein the grid is made up of sub-units of the sacrificial mask, and wherein a characteristic size of the sub-unit, the thickness of the substrate and an etching factor of the process are correlated, so that a ratio between the characteristic size of the sub-units and the thickness of the substrate is between 0.75 and 1.25 of a ratio between the characteristic size and the etching factor, such as between 0.85 and 1.15, such as between 0.95 and 1.05, such as approximately equal.

8. Method of manufacturing an electronic device comprising:
   assembly of a semiconductor device to a leadframe with an etch mask present on a bottom side,
   providing an encapsulation of the semiconductor device, the encapsulation being mechanical anchored in the leadframe,
   patterning a layer of the leadframe in an etching process, wherein the etch mask on the bottom side of the leadframe is provided in accordance with the etch mask of claim 1.

9. Method of patterning the bottom side of a leadframe of an electronic device the bottom side of the leadframe being patterning according to the method of claim 1.

10. A pattern on a package substrate being provided in accordance with an etch mask, wherein the package substrate before etching is being covered with the etch mask, the etch mask comprising at least two sub-masks:
   a first sub-mask covering a first area in a first sub-pattern on the package substrate, the first sub-mask substantially remaining after an etching process, and
   a second sub-mask covering a different second area in a second sub-pattern, the second sub-mask being a sacrificial mask, the sacrificial mask increasing the etching speed in the at least second area,
      wherein after the etching process the area of the package substrate in contact with the first sub-pattern is at least 50% of the area of the first sub-pattern.

* * * * *